United States Patent
Sueoka et al.

(10) Patent No.: US 6,599,816 B2
(45) Date of Patent: Jul. 29, 2003

(54) METHOD OF MANUFACTURING SILICON EPITAXIAL WAFER

(75) Inventors: Kouji Sueoka, Ashiya (JP); Masanori Akatsuka, Osaka (JP); Yasuo Koike, Kashima (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/800,514

(22) Filed: Mar. 8, 2001

(65) Prior Publication Data

US 2001/0021574 A1 Sep. 13, 2001

(30) Foreign Application Priority Data

Mar. 9, 2000 (JP) ........................... 2000-065112

(51) Int. Cl.$^7$ ............................... H01L 21/322
(52) U.S. Cl. .................. 438/471; 438/143; 438/509
(58) Field of Search ................. 48/503, 502, 471, 48/916, 505, 509, 143, FOR 144

(56) References Cited

U.S. PATENT DOCUMENTS 5,961,713 A * 10/1999 Wijaranakula ............... 117/2
6,162,708 A * 12/2000 Tamatsuka et al. ........... 438/503

FOREIGN PATENT DOCUMENTS

| JP | 10-229093 | * 8/1998 | ......... H01L/21/322 |
| JP | 11-189493 | 7/1999 | |
| JP | 2000-68280 | 3/2000 | |

OTHER PUBLICATIONS

"Solid State Phenomena" vol. 57–58 (1997), pp. 53–62 By S. Sadamitsu et al.

* cited by examiner

Primary Examiner—George Fourson
Assistant Examiner—Khiem Nguyen
(74) Attorney, Agent, or Firm—Armstrong, Westerman & Hattori, LLP

(57) ABSTRACT

A method is designed to manufacture a silicon epitaxial wafer exhibiting sufficient gettering capability from the initial stage of the device process. Specifically, the method is to manufacture the silicon wafer with a nitrogen concentration of at least $1 \times 10^{12}$ atoms/cm$^3$ and an oxygen concentration of $10 \sim 18 \times 10^{17}$ atoms/cm$^3$ by annealing at a temperature of $800 \sim 1,100°$ C. after epitaxial growth treatment, satisfying the following equation (a), $$t \geq 3^{3-((T-800)/100)} \tag{a}$$

wherein T(° C.) is temperature, and t(hr) is time, thereby manufacturing a high yield semiconductor device.

6 Claims, 2 Drawing Sheets

METHOD OF MANUFACTURING SILICON EPITAXIAL WAFER

TECHNICAL FIELD

The present invention relates to a method of manufacturing a silicon epitaxial wafer, used as a substrate for circuit devices such as LSI (large scale integrated circuit), having a silicon epitaxial film formed thereon, and more particularly, to a method of manufacturing a silicon epitaxial wafer to exhibit sufficient gettering capability from the initial stage of device manufacturing process by heat treatment under predetermined condition after epitaxial growth treatment.

BACKGROUND OF THE INVENTION

As the high integration trend of silicon semiconductor integrated circuit devices has been rapidly progressed, a silicon wafer from which devices are formed is subjected to increasingly severe specifications. In a device active region of the highly integrated devices, since the existence of crystal defects or metal impurities other than a dopant increases leakage current in the P/N junction or degrade gate oxide film characteristics of MOS devices, the crystal defects or the metal impurities is subject to more rigorous limitation than before.

Conventionally, a wafer produced by slicing a silicon single crystal obtained through the Czochralski method has been used for highly integrated devices. Generally, this wafer contains over-saturated interstitial oxygen at a concentration of $10–18\times10^{17}$ atoms/cm$^3$. Although oxygen is effective for enhancing the strength of a wafer by preventing generation of dislocation or for providing gettering effect, oxygen is well known to deposit in the form of an oxide and to induce crystal defects such as dislocations or stacking faults due to heat histories during production of a device.

The oxide precipitates and the crystal defects generated within a wafer sufficiently away from the device active region are allowed to enjoy the function of intrinsic gettering (hereinafter referred to as "IG") having the effect of gettering metal contamination. Therefore, it is understood that in order to manufacture a high yield device, the existence of the oxide precipitates or the crystal defects within a wafer is indispensable. Hereinafter, the ability that a silicon wafer exhibits IG function is called "IG capability".

The inventors suggested the IG capability evaluation method even taking micro-oxide-precipitates that were hard to be observed in the past into consideration. This IG capability evaluation method is based on the calculation result from the size distribution of oxide precipitates by a calculator simulation using Fokker-Planck equation (refer to Japanese Patent Application No. 10-236662). Specifically, this method is to evaluate whether the following equation (b) is satisfied or not, $$L \times D^{0.6} \geq 1.0 \times 10^7 \quad \text{(b)}$$

wherein L(nm) is the diagonal length of oxide precipitates, and D(/cm$^3$) is the precipitate density. If the above equation is satisfied, the excellent IG capability can be obtained.

On the other hand, a DZ (denuded zone) layer which is free of crystal defects and which has a thickness of about tens of μm is formed near the wafer surface by diffusion of oxygen to the outside, since the wafer is heat-treated at a high temperature of 1,100–1,200° C. for several hours in so-called device active region near the wafer surface so as to form a field oxide film through LOCOS (local oxidation of silicon) or well diffusion layer. The DZ layer serves as a device active region, thereby providing a reduction in crystal defects.

However, according to higher density of integration, a high-energy ion implantation method has been used to form well diffusion layer, and when the device process is carried out at a lower temperature than 1,000° C. in order to manufacture device with shallower junction depth, oxygen is not diffused sufficiently, and thus, the DZ layer is not formed satisfyingly. With this reason, it has become difficult to suppress crystal defects in the device active region.

Accordingly, the oxygen concentration of the substrate was reduced, but the result was unsatisfactory since the crystal defects could not be suppressed sufficiently, and the performance of the wafer was deteriorated by oxygen reduction. Therefore, an epitaxial wafer on which Si epitaxial layer including few crystal defects on the silicon slice to be wafer substrate was grown has been developed and has been used in highly integrated devices.

However, since a high temperature treatment of 1,050–1,200° C. is applied to the process of forming an epitaxial layer on the surface of the wafer, the oxide precipitation within the wafer is significantly suppressed during continuing device process. This phenomenon was reported that in usual cases except for the case of a wafer with a high doping concentration of boron (for example, the case of a resistivity <20 mΩcm), it became remarkable, and thus, gettering effect for metal contamination could not be expected (S. Sadamitsu et al., Solid State Phenomena Vol. 57–58 (1997) p. 53–62).

As described in the above, when an epitaxial wafer is adopted for a highly integrated device, gettering effect for metal contamination by a high temperature treatment during epitaxial growth treatment cannot be expected. As a consequence, a silicon single crystal doped with a nitrogen concentration of at least $10^{13}$ atoms/cm$^3$ was suggested for a substrate of an epitaxial wafer (for example, Japanese Patent Laid-Open No. 11-189493).

When the suggested silicon single crystal is used, in case of an epitaxial wafer which was sliced from the above silicon single crystal and conducted with film-forming on the surface, the oxide precipitates can exist in a density of about $10^8$/cm$^3$ at a previous step before the device process because the oxygen doped during crystal-producing step can serve to promote oxide precipitation. Further, those oxide precipitates grow in accordance with the device process, and form sufficient density and size for gettering, for example, thereby satisfying the above equation (b). Therefore, when the suggested silicon single crystal is used, an epitaxial wafer with the excellent IG capability can be obtained in accordance with the device process.

However, even if an epitaxial wafer is sliced from a silicon single crystal doped with nitrogen, it is difficult to obtain an epitaxial wafer with the density and the size of the oxide precipitates satisfying the above equation (b) before the device process. With this reason, there is a problem that it is easily influenced by metal contamination because it is difficult to obtain the sufficient IG capability in the initial stage of the device process.

SUMMARY OF THE INVENTION

With the foregoing insufficient IG capability problem in the initial stage of the device process in the above-described epitaxial wafer in view, the present invention is aimed at to provide a method of manufacturing a silicon epitaxial wafer, used as a semiconductor device, containing oxide precipitates with density and size sufficient for gettering from the previous step of the device process.

In other words, in the case of an epitaxial wafer treated from a silicon wafer without nitrogen doping, the density of the oxide precipitate nuclei for forming precipitates may be deteriorated or exterminated because of a high temperature treatment during epitaxial growth treatment. With this reason, generally, in the case of IG treatment for an epitaxial wafer, two-step annealing is adopted since a high temperature heat treatment is needed to form oxide precipitates by growing the oxide precipitate nuclei after a low temperature heat treatment (about 700° C.) for several hours to induce the oxide precipitate nuclei within the wafer.

On the other hand, in case of an epitaxial wafer treated from a substrate doped with nitrogen, oxide precipitates can exist by means of the nitrogen function to induce oxide precipitates in the previous step before the device process. However, although the sufficient IG capability is possible according to the device process, excellent IG capability cannot be expected in the initial stage since the density and the size of the oxide precipitates are insufficient.

As described above, the inventors suggested the following equation to evaluate whether the following equation is satisfied or not, $$L \times D^{0.6} \geq 1.0 \times 10^7 \tag{b}$$

wherein L(nm) is the diagonal length of the oxide precipitates, and D(/cm$^3$) is the density of precipitation.

This evaluation method does not need a manufacturing MOS device that is used for the evaluation of gate oxide integrity, and can be conducted in shorter time than conventional evaluation method to measure the electric characteristics such as gate oxide integrity.

Also, it is understood that if the applied range of density and size of the oxide precipitates with a predetermined IG capability is secured, reproduction can be secured at later evaluation. Therefore, if the above-mentioned evaluation using the above equation (b) is applied, it is easy to evaluate the IG capability before starting the device process.

FIG. 1 shows the relation between the density and size (diagonal length) of the oxide precipitates in an example of the present invention and comparative examples that will be described later. The IG capability in the example satisfying the above equation (b) is excellent, and the IG capability in the comparative example unsatisfying the above equation (b) is not shown. Like this, the IG capability in an epitaxial wafer can be determined by evaluating whether the above equation (b) is satisfied or not.

Accordingly, with the above evaluation method, the inventors have developed an epitaxial wafer that can exhibit the IG capability before starting the device process. Specifically, a study was conducted to determine the kind of atom to be doped into silicon single crystal, and to specify the doping concentration. In addition, in consideration of the importance of heat treatment after epitaxial process, various heat treatments were conducted in order to know whether the above equation (b) was satisfied before starting the device process.

As a result, it has been recognized that the predetermined nitrogen and oxygen concentration need to be doped simultaneously in the silicon wafer, and that when an epitaxial wafer treated from the wafer is heat-treated under a predetermined high temperature condition, the epitaxial wafer can exhibit the excellent IG capability before starting the device process.

The present invention has been completed based on the above knowledge and views, and provides a method of manufacturing a silicon epitaxial wafer with the following manufacturing steps: producing a silicon single crystal having a nitrogen concentration of at least $1 \times 10^{12}$ atoms/cm$^3$ and an oxygen concentration in a range of $10-18 \times 10^{17}$ atoms/cm$^3$ (old ASTM), slicing a silicon wafer from said silicon single crystal, growing an epitaxial film on the surface of said silicon wafer, and conducting an annealing so as to satisfy the following equation (a), which is conducted at a temperature in a range of 800–1,100° C. after growing said epitaxial film, $$t \geq 3^{3-((T-800)/100)} \tag{a}$$

wherein T(° C.) is temperature, and t(hr) is time.

DETAILED DESCRIPTION OF THE INVENTION

Figure 1:
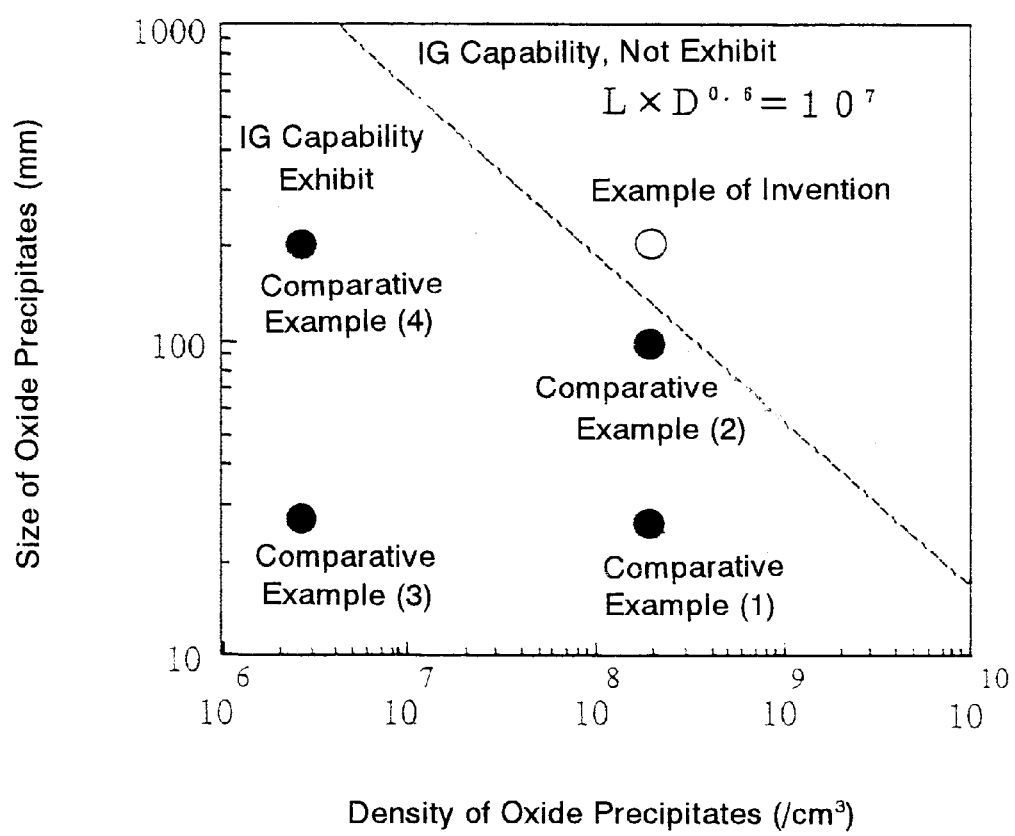
FIG. 1 shows the relation between the density and the size (diagonal length) of the oxide precipitates described in the example of the present invention and the comparative examples.

The present invention is characterized by prescribing the concentration of nitrogen and oxygen doped into a silicon wafer for use in a silicon epitaxial wafer, and by limiting a heat treatment condition after an epitaxial growth process. The reason of the limitation of the present invention is described in the following.

In a wafer doped with nitrogen, although nitrogen is an important element since it serves to induce oxide precipitates, nitrogen concentration of less than $10^{12}$ atoms/cm$^3$ cannot serve this function. With this reason, in the silicon wafer of the present invention, a nitrogen concentration of at least $1 \times 10^{12}$ atoms/cm$^3$ is set. Further, although the upper limit on concentration is not specified here, excessive concentration tends to easily become polycrystal so that a concentration of under $1 \times 10^{16}$ atoms/cm$^3$ is desirable.

In addition, in the silicon wafer of the present invention, the oxygen concentration is adjusted to be in a range of $10-18 \times 10^{17}$ atoms/cm$^3$ (old ASTM). It is because the oxygen precipitation does not occur nearly in the wafer at an oxygen concentration of less than $10 \times 10^{17}$ atoms/cm$^3$ regardless of the nitrogen concentration. On the other hand, the oxygen concentration exceeding $18 \times 10^{17}$ atoms/cm$^3$ tends to easily induce epitaxial defects. Therefore, if the oxygen concentration is out of the range of $10-18 \times 10^{17}$ atoms/cm$^3$ (old ASTM), it is inappropriate as a substrate of the epitaxial wafer according to the present invention.

The present invention has no specific limitation on the epitaxial growth process, and general methods in industrial field can be applied. For example, PVD or CVD can be applied.

The annealing is conducted at a temperature of 800–1,100° C. after said epitaxial growth treatment. It is because the annealing at less than 800° C. needs longer time exceeding tens of hours, thereby increasing manufacturing cost. And an annealing over 1,100° C. has a dangerous possibility that slippage dislocation may be introduced in a wafer. In addition, in the annealing of the present invention, it is preferable that isothermal annealing is conducted at a temperature of 800–1,100° C. in order to obtain the uniform and stable IG capability.

The above annealing at a temperature 800–1,000° C. should satisfy the following equation (a), wherein T(° C.) is temperature, and t(hr) is time, $$t \geq 3^{3-((T-800)/100)} \quad (a)$$

According to the inventors' studies, if a silicon epitaxial wafer with the above-mentioned nitrogen and oxygen concentration, maintains the heating temperature T and time t satisfying the above equation (a), the density and size of the oxide precipitation of the wafer can satisfy the above equation (b). In other words, in order to grow oxide precipitation of a silicon wafer and to induce precipitation by when the density and size of the oxide precipitates can exhibit the excellent IG capability, it is necessary to secure the heating temperature T and heating time t satisfying the above equation (a).

EXAMPLES

To verify the effects of a silicon epitaxial wafer disclosed in the present invention, comparison with comparative examples will be explained in details. To begin with, as an example according the present invention, a silicon wafer is sliced from a single crystal, produced by Czochralski method, to be doped with a nitrogen concentration of $1 \times 10^{14}$ atoms/cm$^3$ and an oxygen concentration of $15 \times 10^{17}$ atoms/cm$^3$ (old ASTM). And then, the formation of an epitaxial film is conducted after baking the wafer in a hydrogen atmosphere at 1,150° C. for 80 seconds by utilizing a horizontal CVD epitaxial apparatus of lamp heating type. In a film-forming step, an epitaxial film with a thickness of about 4 μm was formed at a temperature of 1,080° C. by using trichlorosilane as raw material gas.

Further, a silicon epitaxial wafer of the present invention was manufactured through isothermal annealing under a nitrogen atmosphere at 1,000° C. for 4 hours by using horizontal diffusion furnace. According to this equation for heat treatment, the result of t(4 hr)≥3 satisfies the above equation (a).

Next, as comparative examples, the epitaxial wafers of the following comparative examples 1 to 4 were manufactured.

Comparative Example 1 an epitaxial wafer in which epitaxial treatment is conducted under the same condition as the present invention to the silicon wafer having the same nitrogen and oxygen concentration as the example of the present invention (but, a high temperature heat treatment is not conducted).

Comparative Example 2 an epitaxial wafer further heat-treated in a nitrogen atmosphere at 1,000° C. for 1 hour to the epitaxial wafer of the above comparative example 1 (does not have the equation (a))

Comparative Example 3 an epitaxial wafer in which epitaxial treatment is conducted to a silicon wafer doped with no nitrogen and an oxygen concentration of $15 \times 10^{17}$ atoms/cm$^3$ under the same condition as the present invention. (A high temperature heat treatment cannot be conducted since the nitrogen concentration is beyond adequate range.)

Comparative Example 4 an epitaxial wafer to conduct isothermal annealing to the epitaxial wafer of the comparative example 3 under the same condition as the example of the present invention (The nitrogen concentration is beyond adequate range).

Using the above-described example and comparative examples 1 to 4, the IG capability at the extremely initial stage of the device process was evaluated. First, after each surface of the wafers was treated by contamination process at a Ni concentration of $10^{12}$ atoms/cm$^3$, Ni was diffused within the wafer through heat treatment at 1,000° C. for 10 minutes in order not to change the state of oxygen precipitation. Next, the pit density of Ni silicide, formed on each surface of the wafers, was measured by conducting a defect selective etching (using Wright etchant) for 5 minutes to the treated wafers.

Figure 2:
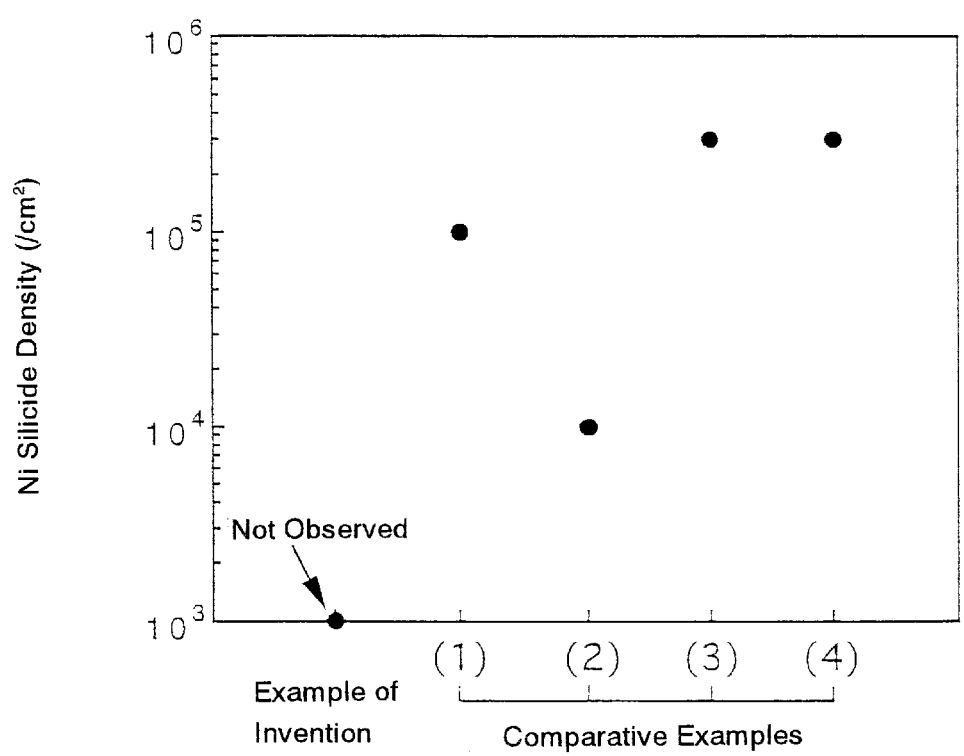
FIG. 2 shows the measured results of Ni silicide density on the surface of epitaxial wafer in the example.

FIG. 2 shows the results of measuring the density of Ni silicide of the surface of the epitaxial wafer in the example of the present invention. As shown in FIG. 2, Ni silicide pits were not found in the example of the present invention so that the excellent IG capability from the extremely initial stage of the device process can be obtained.

In this regard, since all of the comparative examples 1 to 4 lack any one of the conditions according to the present invention, Ni silicide pits were observed on the surface of those epitaxial wafers. With this reason, it is understood that the comparative examples 1 to 4 cannot exhibit the excellent IG capability from the initial stage of the device process.

As described above, according to the present invention, through an annealing under predetermined condition after the epitaxial growth treatment, it is possible to form oxide precipitates with density and size sufficient for gettering before starting the device process, thereby sufficient gettering capability can be exhibited from the initial stage of the device process. Accordingly, a high yield device can be manufactured.

What is claimed is:

1. A method of manufacturing a silicon epitaxial wafer comprising the steps of: producing a silicon single crystal having a nitrogen concentration of at least $1 \times 10^{12}$ atoms/cm$^3$ and an oxygen concentration in a range of $10-18 \times 10^{17}$ atoms/cm$^3$ (old ASTM);

slicing a silicon wafer from said silicon single crystal;

growing an epitaxial film on the surface of the silicon wafer; and conducting an isothermal annealing at a temperature in a range of 800–1,100° C. after growing said epitaxial film, so as to satisfy the following equation (a), $$t \geq 3^{3-((T-800)/100)} \quad (a)$$

wherein T(° C.) is temperature, and t(hr) is time.

2. A method of manufacturing a silicon epitaxial wafer according to claim 1, wherein the nitrogen concentration of said silicon single crystal is $1 \times 10^{12}$ atoms/cm$^3$–$1 \times 10^{16}$ atoms/cm$^3$.

3. A method of manufacturing a silicon epitaxial wafer according to claim 1, wherein said epitaxial film is grown on the surface of the wafer by PVD or CVD.

4. A method of manufacturing a silicon epitaxial wafer according to claim 1, wherein, when said epitaxial film is grown by PVD, a trichlorosilane is used as raw material gas, and the epitaxial film having a thickness of about 4 μm is formed at a temperature of 1,080° C.

5. A method of manufacturing a silicon epitaxial wafer according to claim 1, wherein said epitaxial film is grown on the surface of the wafer after baking in a hydrogen atmosphere at a temperature of 1,150° C. for 80 seconds.

6. A method of manufacturing a silicon epitaxial wafer according to claim 1, wherein the isothermal annealing is conducted in a nitrogen atmosphere at a temperature of 1,000° C. for 4 hours.

* * * * *

UNITED STATES PATENT AND TRADEMARK OFFICE
CERTIFICATE OF CORRECTION

PATENT NO.    : 6,599,816 B2
DATED         : July 29, 2003
INVENTOR(S)   : Sueoka, Kouji et al.

It is certified that error appears in the above-identified patent and that said Letters Patent is hereby corrected as shown below:

<u>Title page,</u>
Item [73], Assignee, change "Sumitomo Metal Industries, Ltd., Osaka (JP)" to
-- Sumitomo Mitsubishi Silicon Corporation, Tokyo (JP) --

Signed and Sealed this

Twenty-fifth Day of November, 2003

JAMES E. ROGAN
*Director of the United States Patent and Trademark Office*